United States Patent
Midya et al.

(10) Patent No.: US 6,504,427 B2
(45) Date of Patent: Jan. 7, 2003

(54) SWITCHING AMPLIFIER HAVING DIGITAL CORRECTION AND METHOD THEREFOR

(75) Inventors: Pallab Midya, Schaumburg, IL (US); William J. Roeckner, Carpentersville, IL (US); Poojan A. Wagh, Sleepy Hollow, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/872,283

(22) Filed: May 31, 2001

(65) Prior Publication Data

US 2002/0180518 A1 Dec. 5, 2002

(51) Int. Cl.[7] ................................................. H03F 3/38
(52) U.S. Cl. ........................... 330/10; 363/71; 375/238; 330/207 A; 330/251
(58) Field of Search ............................... 330/10, 207 A, 330/251; 375/238; 363/71

(56) References Cited

U.S. PATENT DOCUMENTS

| | | | | |
|---|---|---|---|---|
| 4,021,745 A | * | 5/1977 | Suzuki et al. ................. | 330/10 |
| 5,253,155 A | * | 10/1993 | Yamamoto .................... | 363/71 |
| 5,777,512 A | * | 7/1998 | Tripathi et al. ........... | 330/207 A |
| 5,974,089 A | * | 10/1999 | Tripathi et al. ............... | 330/10 |
| 6,150,969 A | | 11/2000 | Melanson .................... | 341/143 |
| 6,362,683 B1 | * | 3/2002 | Miao et al. ................... | 330/10 |

FOREIGN PATENT DOCUMENTS

| | | | |
|---|---|---|---|
| WO | WO 92/12572 | 7/1992 | ........... H03F/3/393 |
| WO | WO 98/44626 | 10/1998 | ........... H03F/3/217 |
| WO | WO 99/45641 | 9/1999 | ........... H03F/3/217 |
| WO | WO 00/33448 | 6/2000 | |
| WO | WO 01/10016 A1 | 2/2001 | ........... H03F/3/217 |

\* cited by examiner

*Primary Examiner*—Michael B Shingleton
(74) *Attorney, Agent, or Firm*—Robert L. King

(57) ABSTRACT

A switching amplifier (15) includes a power stage (18) and a digital correction circuit (16). The digital correction circuit (16) is for correcting nonlinearity and power supply noise introduced into a digital signal during power stage amplification. The digital correction circuit (16) receives a digital pulse modulated input signal from a processor (14) and an amplified pulse modulated output signal from the power stage (18), and performs a discrete-time pulse edge correction on the digital pulse modulated input signal to provide a corrected digital pulse modulated signal. The corrected digital pulse modulated signal is used as an input for the power stage (18).

19 Claims, 4 Drawing Sheets

SWITCHING AMPLIFIER HAVING DIGITAL CORRECTION AND METHOD THEREFOR

RELATED APPLICATION

This application is related to Midya et al., U.S. Ser. No. 09/477,985, entitled "Switching Circuit and Method Therefor" filed on Jan. 5, 2000.

FIELD OF THE INVENTION

This invention relates generally to digital amplifiers, and more specifically, to error correction in digital amplifiers.

BACKGROUND OF THE INVENTION

Digital audio switching power amplifiers are well known and widely used. Such amplifiers receive a digital audio signal which has been pulse modulated. Most high efficiency digital audio switching power amplifiers are based on Pulse-width modulation (PWM). PWM is widely used in a variety of applications such as digital audio amplifiers and control applications including motor controllers. Many of these applications convert a sampled digital signal to a digital pulse-width modulation signal in order to obtain high efficiency and high accuracy. The PWM signal is presented to a switching amplifier that performs a level shifting function to translate the digital PWM input signal to a digital PWM signal having significantly higher voltage levels. To accomplish the power amplification, a higher voltage power supply is used in which the power supply voltage is directly used as the digital logic one value. Because power supplies have noise coupled into the voltage, the noise becomes a source of error in the switching amplifier. The digital switching amplifier has no ability to reject the power supply noise. Practical implementations of a switching amplifier generate distorted output pulse signals. These distortions result in nonlinear amplification of the modulated output signal. Therefore, most switching amplifiers have both nonlinearity and power supply noise error.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
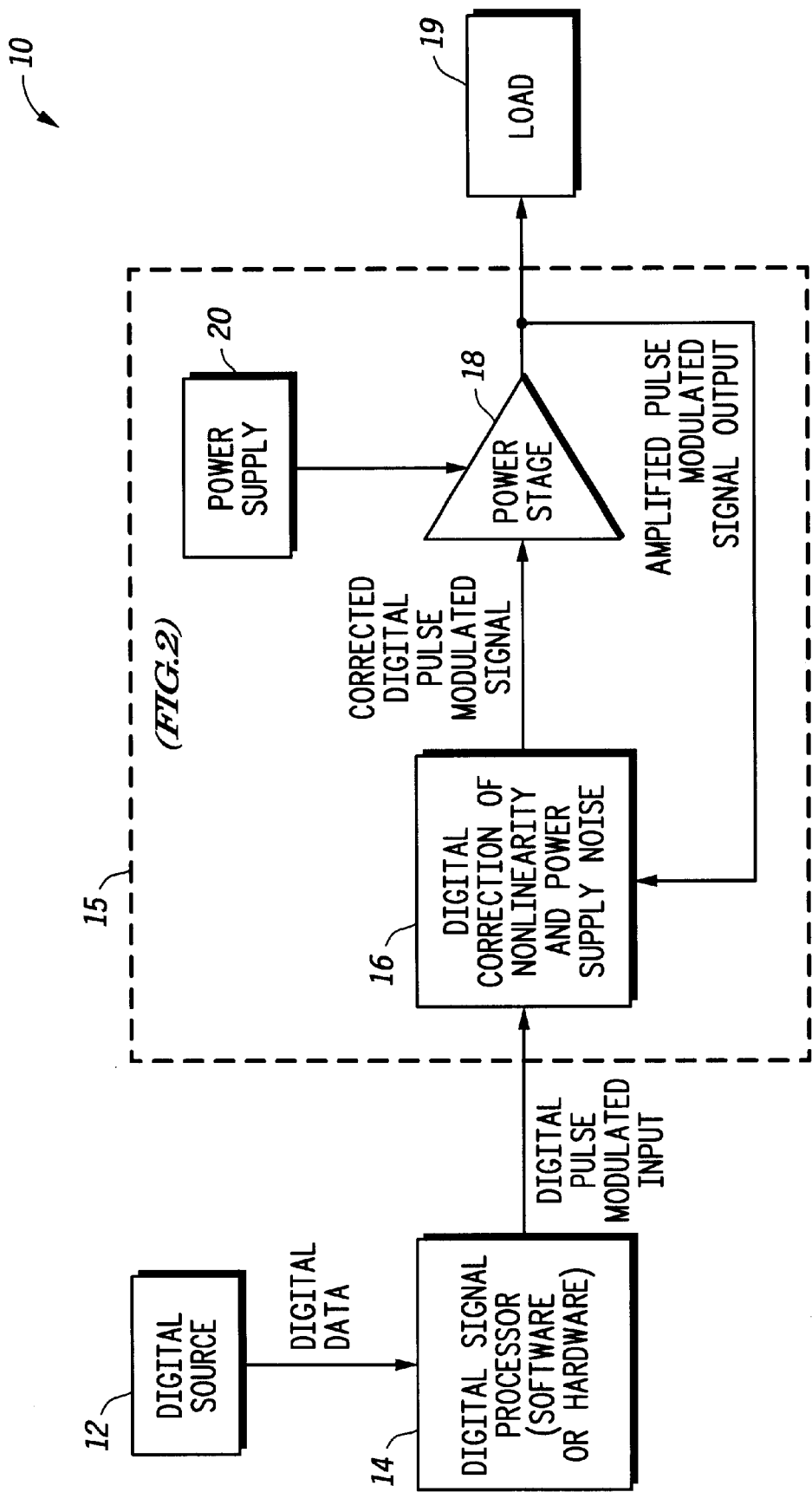
FIG. 1 illustrates in block diagram form a switching amplifier having digital correction in accordance with the present invention.

FIG. 1 illustrates a Switching Amplifier System 10 having digital correction for error created by nonlinearity and power supply noise. A Digital Source 12 has an output for providing digital data to an input of a Digital Signal Processor 14. The digital signal processor function may be implemented either in software or with hardware components. It should be understood that Digital Signal Processor 14 may be any type of signal processing function that processes in some predetermined manner the received digital data. In the illustrated form, an output of Digital Signal Processor 14 is connected to an input of a Digital Correction Of Nonlinearity and Power Supply Noise Module 16. Digital Correction of Nonlinearity and Power Supply Noise Module 16 functions as a digital correction circuit. An output of Digital Correction of Nonlinearity and Power Supply Noise Module 16 is connected to an input of a Power Stage 18 for providing a corrected digital pulse modulated signal. An output of Power Stage 18 is connected to an input of a Load 19 and to a control input of the Digital Correction of Nonlinearity and Power Supply Noise Module 16. The output of Power Stage 18 provides an amplified pulse modulated output signal. A Power Supply 20 is connected to Power Stage 18 for powering Power Stage 18. As illustrated, the Digital Correction of Nonlinearity and Power Supply Noise Module 16, Power Supply 20 and Power Stage 18 represent a Switching Power Amplifier and Digital Correction Circuitry 15.

In operation, Digital Source 12 provides digital data to the Digital Signal Processor 14. The digital data may be music or any other form of information, such as a motor control signal. Digital Signal Processor 14 processes the digital data by converting its form. In one embodiment, Digital Signal Processor 14 modulates the digital data using pulse modulation. Two forms of pulse modulation include pulse width modulation (PWM) and pulse density modulation (PDM). In a preferred form, Digital Signal Processor 14 modulates the digital data using PWM. It should be noted that the function of Digital Signal Processor 14 may be implemented using either software code or by performing the modulation in hardware. A digital pulse modulated signal is then presented to the Digital Correction of Nonlinearity and Power Supply Noise Module 16 which functions to correct errors originating from nonlinearity and power supply noise. A corrected digital pulse modulated signal is presented to the Power Stage 18 that amplifies or level shifts the digital pulse modulated signal to provide an amplified pulse modulated signal output. The amplified pulse modulated signal output may be used to drive a load. The Load 19 may be implemented as any type of load, such as a motor or a speaker if the digital data is music or audio information. In some applications, a low pass filter (not shown) is connected between the Power Stage 18 and the Load 19. The low pass filter prevents the switching frequency and its harmonics from being coupled to the load. Power Supply 20 is used to power the Power Stage 18 and determines the supply voltage rail value that a logic one output value will have. The digital output of Power Stage 18 is also used as a feedback signal to the Digital Correction of Nonlinearity and Power Supply Noise Module 16 to provide digital correction for the digital switching amplifier as will be described further in connection with FIG. 2.

Figure 2:
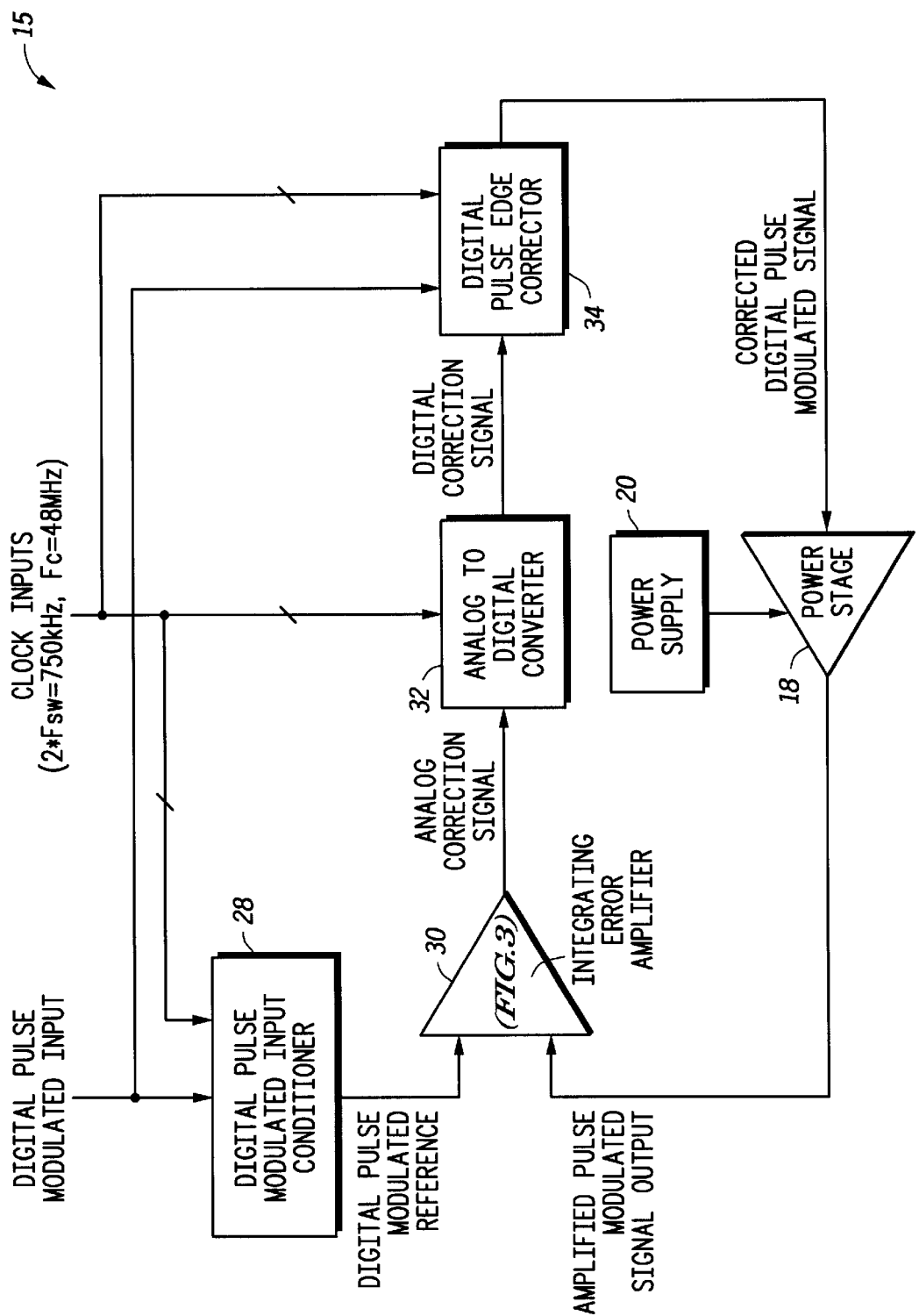
FIG. 2 illustrates in block diagram form the digital correction of nonlinearity and power supply noise.

Illustrated in FIG. 2 is a further detail of one implementation of the Switching Power Amplifier and Digital Correction Circuitry 15 of FIG. 1. A digital pulse modulated input is connected to an input of both a Digital Pulse Modulated Input Conditioner 28 and a first input of a Digital Pulse Edge Corrector 34. In one form, the digital pulse modulated input is a digital pulse width modulated (PWM) input signal; however other types of digital pulse modulated signals may be used. An output of the Digital Pulse Modulated Input Conditioner 28 is connected to a first input of an Integrating Error Amplifier 30 for providing a digital pulse modulated reference signal. An output of the Integrating Error Amplifier 30 is connected to a first input of an Analog-to-Digital Converter 32 for providing an analog correction signal. An output of Analog-to-Digital Converter 32 is connected to a second input of the Digital Pulse Edge Corrector 34 for providing a digital correction signal. A first Clock signal is connected to a first clock input of Analog-to-Digital Converter 32, to a first clock input of the Digital Pulse Edge Corrector 34, and to a first clock input of the Digital Pulse Modulated Input Conditioner 28 for providing a clock having a frequency of 2 times the switching frequency, Fsw. In one form, the 2*Fsw frequency is 750 kHz. A second Clock signal is connected to a second clock input of Analog-to-Digital Converter 32, to a second clock input of the Digital Pulse Edge Corrector 34, and to a second clock input of the Digital Pulse Modulated Input Conditioner 28 for providing a clock signal labeled Fc. In one form, the Fc frequency is 48 MHz. An output of the Digital Pulse Edge Corrector 34 is connected to an input of a Power Stage 18 and provides a corrected digital pulse modulated signal. An output of the Power Stage 18 is connected to a second input of the Integrating Error Amplifier 30 and provides an amplified pulse modulated signal output signal.

In operation, a digital pulse modulated input signal is provided to the Digital Pulse Edge Corrector 34. Digital Pulse Edge Corrector 34 functions to compensate for power supply noise errors and nonlinearity by adjusting the timing of when one or both edges of each digital pulse occur and thus performs a discrete-time pulse edge correction. Adjustment may occur to a leading edge, a trailing edge or to both edges of the digital pulse modulated input signal. The compensated digital signal is then provided to Power Stage 18 which functions to level shift the digital signal. The output of Power Stage 18 that is connected or coupled to a load is not shown in FIG. 2. The compensation method taught herein uses feedback; therefore, the output of Power Stage 18 is connected to the Integrating Error Amplifier 30 in the form of an amplified pulse modulated signal output. It should be noted that in some applications there may be a need to attenuate the amplified pulse modulated signal prior to the signal being used by the Integrating Error Amplifier 30. In such applications, a resistive element (not shown) would be connected between the output of Power Stage 18 and the second input of Integrating Error Amplifier 30. Integrating Error Amplifier 30 uses both the digital output signal provided by Power Stage 18 and a digital reference signal that is provided by the Digital Pulse Modulated Input Conditioner 28. Because the same digital pulse modulated input signal is connected to both the Digital Pulse Modulated Input Conditioner 28 and the Digital Pulse Edge Corrector 34, the digital pulse modulated input conditioner must perform some phase compensation in the form of providing signal delay. The phase compensation is necessary so that both the reference signal and the amplified pulse modulated signal output that are presented to the Integrating Error Amplifier 30 have similar phase and timing. Digital Pulse Modulated Input Conditioner 28 is a digital pulse modulated input signal conditioner for adding compensation for power stage delay. Digital Pulse Modulated Input Conditioner 28 also functions to compensate the digital pulse modulated input by reducing any jitter and power supply noise that may have been previously injected into the input.

The Integrating Error Amplifier 30 functions to compare the reference signal with the output of the Power Stage 18. Any differences between the two signals will be interpreted as an error. Integrating Error Amplifier 30 further functions to amplify the error while suppressing the switching frequency of the pulse modulation and its harmonics. The amplified error is used to create an analog correction signal for use by the Digital Pulse Edge Corrector 34 to be applied to a subsequent digital input signal edge. The analog correction signal provided by Integrating Error Amplifier 30 is however in analog form. Therefore, a conversion of the correction signal is performed by the Analog-to-Digital Converter 32 to control the Digital Pulse Edge Corrector 34 with a digital control signal. It should be understood that various types of A/D converters may be used to implement Analog-to-Digital Converter 32. Also, the digital pulses provided to the Switching Power Amplifier and Digital Correction Circuitry 15 may represent a digital input signal of any bit width.

It should be noted that the error sources that exist in known digital switching amplifiers have been corrected by the movement of digital signal edges. The Switching Power Amplifier and Digital Correction Circuitry 15 provides a negative feedback system which provides appropriate loop gain to correct for non-idealities that modify the output of Power Stage 18. By selectively adjusting the edges of the digital pulses, correction for the error sources is possible. Depending upon the nature of the error source, some digital pulse edges will be advanced in time and other digital pulse edges will be delayed. In this manner, the Digital Pulse Edge Corrector 34 functions as a tapped delay line or a clocked delay stage that modifies digital pulse widths to compensate for nonlinearity and power supply noise. Digital Pulse Edge Corrector 34 corrects the digital pulse modulated input signal by implementing a predetermined delay or advance based on the digital correction signal.

Figure 3:
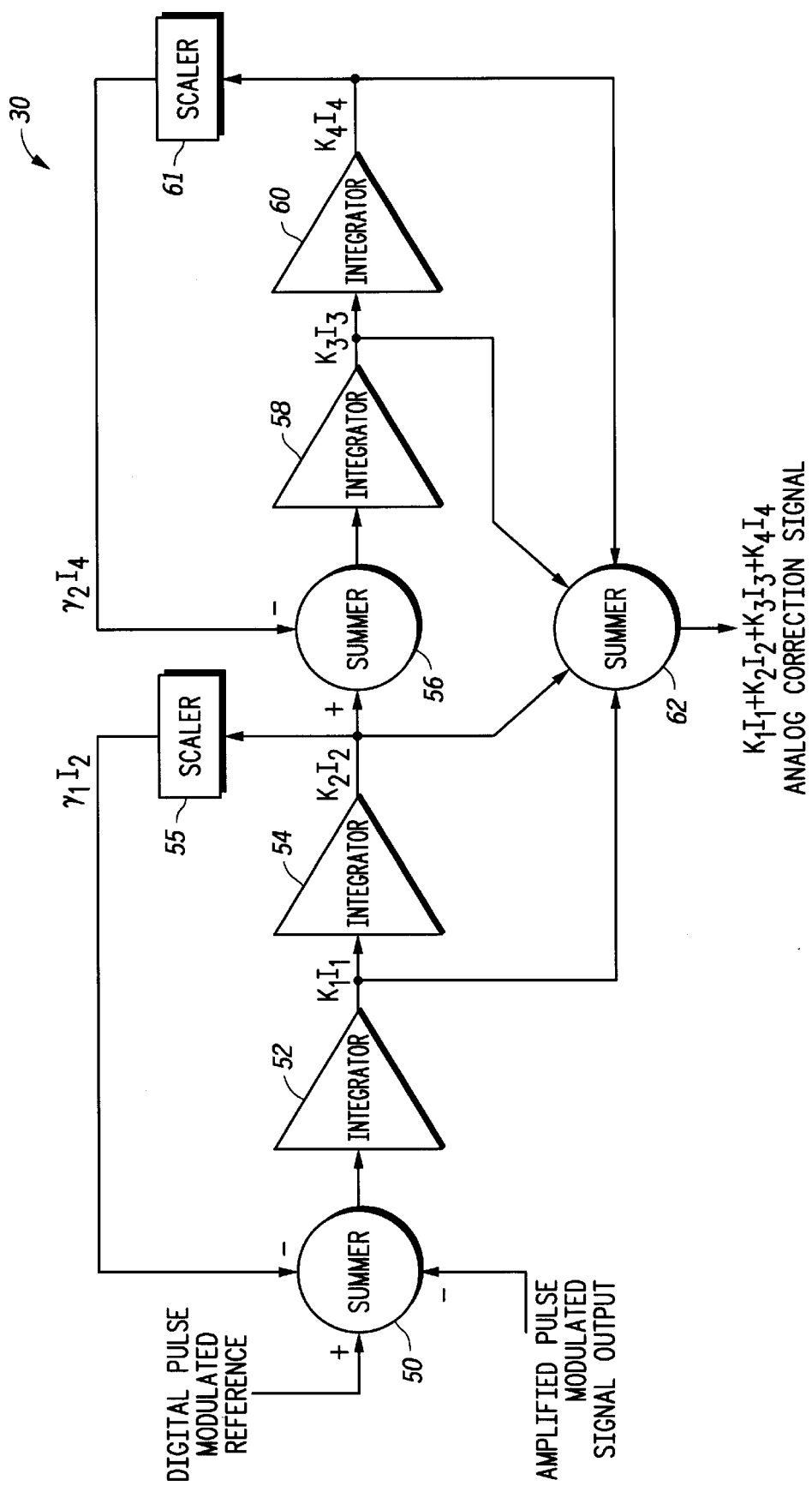
FIG. 3 illustrates in block diagram form an integrating error amplifier of FIG. 2.

Illustrated in FIG. 3 is an exemplary embodiment of the Integrating Error Amplifier 30 of FIG. 2. Integrating Error Amplifier 30 generally has a Summer 50 (a summing element), an Integrator 52, an Integrator 54, a Summer 56, an Integrator 58, an Integrator 60 and a Summer 62. The Digital Pulse Modulated Reference signal from the Digital Pulse Modulated Input Conditioner 28 is connected to an add input of Summer 50 and the Amplified Pulse Modulated Signal output from Power Stage 18 is connected to a subtract input of Summer 50. An output of Summer 50 is connected to an input of Integrator 52. An output of Integrator 52 is connected to an input of Integrator 54 and to a first add input of Summer 62. An output of Integrator 54 is connected to an add input of Summer 56, to an input of a Scaler 55 and to a second add input of Summer 62. An output of Scaler 55 is connected to a second subtract input of Summer 50. An output of Summer 56 is connected to an input of an Integrator 58. An output of Integrator 58 is connected to an input of Integrator 60 and to a third add input of Summer 62. An output of Integrator 60 is connected to an input of a Scaler 61 and to a fourth add input of Summer 62. An output of Scaler 61 is connected to a subtract input of Summer 56. The output of Integrator 52 is a term, $K_1*I_1$. The output of Integrator 54 is a term, $K_2*I_2$. The output of Integrator 58 is a term, $K_3*I_3$. The output of Integrator 60 is a term, $K_4*I_4$. The output of Scaler 55 is a term, $\gamma_1*I_2$, and the output of Scaler 61 is a term, $\gamma_2*I_4$.

In operation, the Integrating Error Amplifier 30 implements a filtering operation to selectively filter error between the reference signal and the amplified pulse modulated signal output. Integrating Error Amplifier 30 implements a band pass filter of nth order, where n is a positive integer. Summer 50 functions to receive the digital pulse modulated reference signal and the amplified pulse modulated signal output from Power Stage 18. A difference signal (i.e. a summation result) is generated from the two inputs and an output of Integrator 54. The sum of the three signals is used to form a signal that is sequentially integrated by Integrators 52 and 54. Integrator 52 provides a first term labeled $K_1*I_1$ that is connected to Summer 62. Integrator 54 provides a second term labeled $K_2*I_2$ that is summed with $K_1*I_1$. The output of Integrator 54 is provided to Summer 56 that forms a difference signal with an output of Integrator 60. The difference signal is sequentially integrated by both Integrator 58 and Integrator 60 which respectively generate the terms $K_3*I_3$ and $K_4*I_4$. The terms $K_3*I_3$ and $K_4*I_4$ are summed by Summer 62 with $K_1*I_1$ and $K_2*I_2$ to provide the analog correction signal of FIG. 2. It should be understood that although in the illustrated form four integrators have been implemented, any number of integrators may be used. The number of integrators that are used will determine the number of poles that the whole system will have.

In one form, each of Integrators 52, 54, 58 and 60 may be implemented as a conventional RC (resistor/capacitor) integrating amplifier (either single-ended or differential). The selection of the resistor and capacitor values is important in order to make sure that the integrating Error Amplifier 30 remains stable. The total number of frequency poles that will exist in the closed loop system will be one more than the total number of poles in Integrating Amplifier 30. The number of system poles may not be initially apparent. In order to understand how to select proper values for the resistors and capacitors of the Integrating Error Amplifier 30, a brief mathematical analysis is helpful.

For the fourth order Integrating Error Amplifier 30 of FIG. 3, the transfer function for the analog correction signal is:

$$H(s) = \frac{K_1 s^3 + K_2 s^2 + (K_1 \gamma_2 + K_3)s + K_2 \gamma_2 + K_4}{(s^2 + \gamma_1)(s^2 + \gamma_2)} \quad (1)$$

There is a time delay between the analog correction signal, its conversion to the digital correction signal by the Analog-to-Digital Converter 32 and the pulse edge correction performed by Digital Pulse Edge Corrector 34. For a pulse width modulation system, this delay is on an average equal to $\frac{1}{4}^{th}$ of the switching time period, where a switching time period is defined as the time between successive pulses. This time delay can be modeled by the following equation:

$$e^{\frac{-s}{2}} \cong \frac{1 - \frac{s}{4}}{1 + \frac{s}{4}} \quad (2)$$

Combining equation one and equation two for obtaining the overall closed loop system transfer function results in the following equation:

$$T(s) = \frac{s^5 + 4s^4 + (\gamma_1 + \gamma_2)s^3 + 4(\gamma_1 + \gamma_2)s^2 + \gamma_1 \gamma_2 s + 4\gamma_1 \gamma_2}{s^5 + (4 - K_1)s^4 + (\gamma_1 + \gamma_2 + 4K_1 - K_2)s^3 +} \quad (3)$$
$$(4\gamma_1 + 4\gamma_2 + 4K_2 - \gamma_2 K_1 - K_3)s^2 +$$
$$(\gamma_1 \gamma_2 + 4\gamma_2 K_1 + 4K_3 - \gamma_2 K_2 - K_4)s +$$
$$(4\gamma_1 \gamma_2 + 4\gamma_2 K_2 + 4K_4)$$

An additional system pole is introduced as a result of the time delay mentioned above. In particular, in the example above a fifth pole is introduced for the fourth order integrating error amplifier of FIG. 3.

Figure 4:
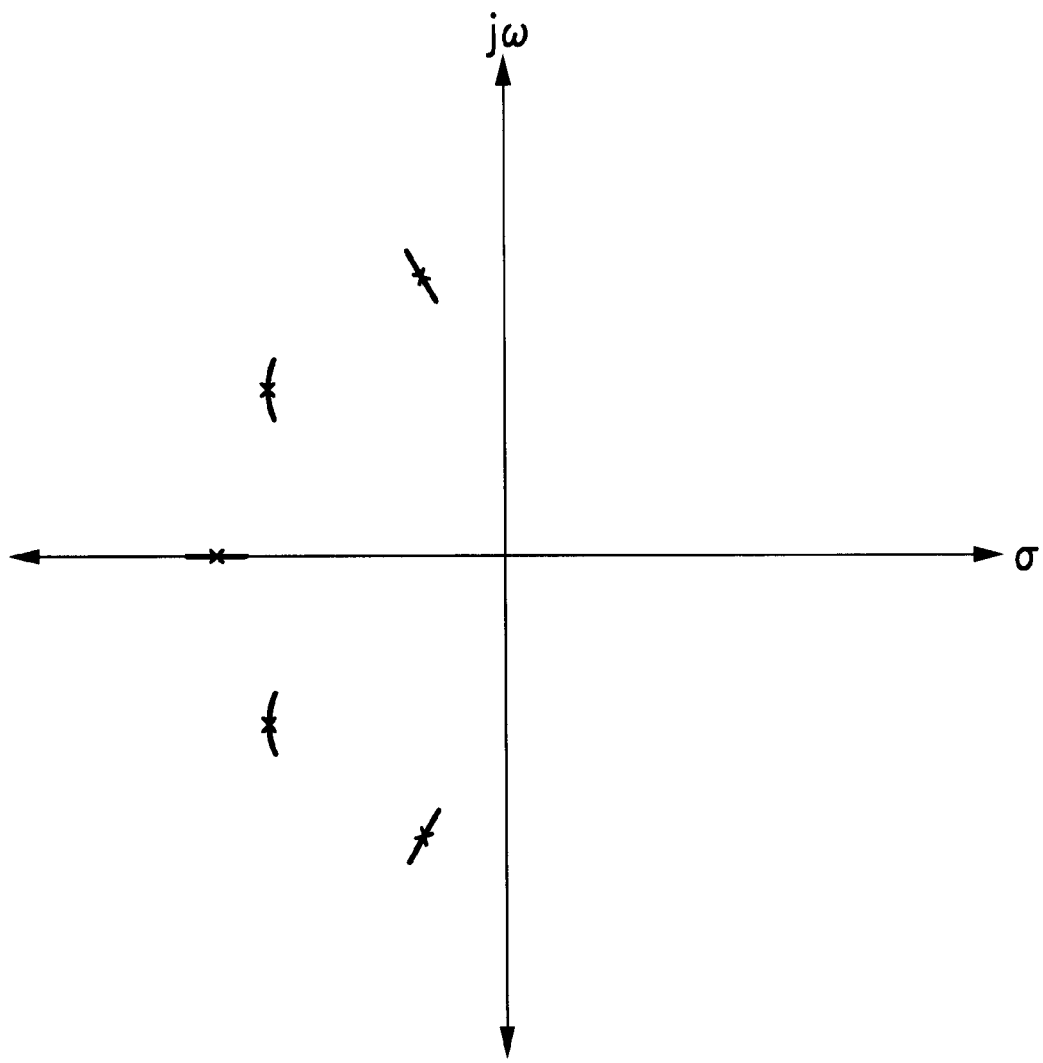
FIG. 4 illustrates in graphical form a root locus plot of the digital correction system of FIG. 2.

Illustrated in FIG. 4 in the s-domain is a root locus plot of the closed loop system containing the fourth order Integrating Error Amplifier 30. Plotted on a two dimensional graph are ideal locations of each of the five poles of the closed loop system, each being designated by an "X". The root locus is plotted as the values of resistance and capacitance in each of the RC integrators of Integrating Error Amplifier 30 are varied. The vertical axis is the imaginary jω axis designating the complex frequency component. The horizontal axis is the real (σ) axis designating the real frequency component. The ideal locations of each of the five poles lies within a circular arc centered at the intersection of the real and complex frequency axes. Additionally, each of the lines around the ideal pole placement illustrates the movement of that pole as the RC values change. In order to design a closed loop system that will have frequency stability, all of the system poles must lie on the left half of the imaginary jω axis.

By now it should be apparent that there has been provided a digital switching amplifier that has compensation for nonlinearity error and power supply noise. A corrected digital pulse modulated signal is provided to the input of the Power Stage 18 for correcting for nonlinearity in the amplified pulse modulated output signal during power stage amplification. The present invention allows for use of a low cost power supply and power stage while maintaining high performance. The compensation method and apparatus taught herein is very suitable for integration into a single integrated circuit. Additionally, portions of the illustrated system may be readily implemented with software code rather than using dedicated hardware. The present invention performs multiple bit correction that promotes stability within a high order system. Multiple bit operation further enhances the dynamic range capabilities of the system.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switching amplifier, comprising:
   a power stage having an input and an output, the output for providing an amplified pulse width modulated output signal; and
   a digital correction circuit having a first input for receiving a digital pulse width modulated input signal, a second input coupled to the output of the power stage for receiving the amplified pulse width modulated output signal, and an output coupled to the input of the power stage, the digital correction circuit providing a corrected digital pulse width modulated signal to the input of the power stage for correcting for nonlinearity in the amplified pulse width modulated output signal during power stage amplification.

2. The switching amplifier of claim 1, wherein the digital correction circuit performs a discrete-time pulse edge correction on both a leading edge and a trailing edge of the digital pulse modulated input signal to provide the corrected digital pulse modulated signal.

3. The switching amplifier of claim 1 wherein the digital correction circuit and the power stage processes and provides the corrected digital pulse width modulated signal as a single signal per input of a load.

4. A switching amplifier comprising:
a power stage having an input and an output, the output for providing an amplified pulse modulated output signal; and
a digital correction circuit having a first input for receiving a digital pulse modulated input signal, a second input coupled to the output of the power stage for receiving the amplified pulse modulated output signal, and an output coupled to the input of the power stage, the digital correction circuit providing a corrected digital pulse modulated signal to the input of the power stage for correcting for nonlinearity in the amplified pulse modulated output signal during power stage amplification, the digital correction circuit further comprising:
an error amplifier having a first input for receiving a digital pulse modulated reference signal, a second input for receiving the amplified pulse modulated output signal, and an output for providing an analog correction signal;
an analog-to-digital converter having an input coupled to the output of the error amplifier for receiving the analog correction signal, and an output for providing a digital correction signal; and
a digital pulse edge corrector having a first input coupled to the output of the analog-to-digital converter, a second input for receiving the digital pulse modulated input signal, and an output coupled to the input of the power stage.

5. The switching amplifier of claim 4, wherein the digital pulse edge corrector comprises a tapped delay line, the tapped delay line for correcting the digital pulse modulated input signal by a predetermined delay or advance based on the digital correction signal.

6. The switching amplifier of claim 4, wherein the error amplifier comprises:
a first summing element having a first input for receiving the digital pulse modulated reference signal, a second input for receiving the amplified pulse modulated output signal, a third input, and an output;
a first integrator having an input coupled to the output of the first summing element, and an output;
a second integrator having an input coupled to the output of the first integrator, and an output coupled to the third input of the first summing element;
a second summing element having a first input coupled to the output of the second integrator, a second input, and an output;
a third integrator having an input coupled to the output of the second summing element, and an output;
a fourth integrator having an input coupled to the output of the third integrator, and an output coupled to the second input of the second summing element; and
a third summing element having a first input coupled to the output of the first integrator, a second input coupled to the output of the second integrator, a third input coupled to the output of the third integrator, a fourth input coupled to the output of the fourth integrator, and an output for providing the analog correction signal.

7. The switching amplifier of claim 4, wherein the error amplifier is characterized as implementing a band pass filter of nth order, where n is a positive integer.

8. The switching amplifier of claim 4, wherein the digital pulse edge corrector adds a pulse edge correction to a leading edge of the digital pulse modulated input signal.

9. The switching amplifier of claim 4, further comprising a digital pulse modulated input signal conditioner for adding compensation for power stage delay, jitter and power supply noise, based on the digital pulse modulated input signal, to generate the digital pulse modulated reference signal.

10. A switching amplifier, comprising:
a power stage having an input and an output, the output for providing an amplified pulse modulated output signal;
an integrating error amplifier having a first input for receiving a digital pulse modulated reference signal, a second input for receiving the amplified pulse modulated output signal, and an output for providing an analog correction signal;
an analog-to-digital converter having an input coupled to the output of the integrating error amplifier for receiving the analog correction signal, and an output for providing a digital correction signal; and
a digital pulse edge corrector having a first input coupled to the output of the analog-to-digital converter, a second input for receiving a digital pulse modulated input signal, and an output coupled to the input of the power stage.

11. The switching amplifier of claim 10, wherein the digital pulse edge corrector comprises a tapped delay line, the tapped delay line for delaying the digital pulse modulated input signal by a predetermined delay based on the digital correction signal.

12. The switching amplifier of claim 10, wherein the switching amplifier is implemented as an integrated circuit.

13. The switching amplifier of claim 10, wherein the digital pulse edge corrector adds a pulse edge correction to a leading edge of the digital pulse modulated input signal.

14. The switching amplifier of claim 10, wherein the digital pulse modulated input signal is characterized as being a digital pulse width modulated input.

15. The switching amplifier of claim 10, further comprising a digital pulse modulated input signal conditioner for adding compensation for power stage delay, jitter, and power supply noise, based on the digital pulse modulated input signal, to generate the digital pulse modulated reference signal.

16. The switching amplifier of claim 10, wherein the integrating error amplifier is characterized as implementing a band pass filter of nth order, where n is a positive integer.

17. A method for correcting for nonlinearities in a switching amplifier, comprising:
receiving a digital pulse modulated input signal;
summing an amplified pulse modulated output signal with a digital pulse modulated reference signal to produce a summation result;

integrating the summation result to produce an analog correction signal;

converting the analog correction signal to a digital correction signal;

applying a discrete-time pulse edge correction to the digital pulse modulated input signal to produce a corrected digital pulse modulated signal; and amplifying the corrected digital pulse modulated signal in the switching amplifier to produce the amplified pulse modulated output signal.

18. The method of claim 17 wherein the applying of a discrete-time pulse edge correction further comprises applying the discrete-time pulse edge correction to both a leading edge and to a trailing edge of the digital pulse modulated input signal.

19. The method of claim 17 further comprising:

generating the digital pulse modulated reference signal by conditioning the digital pulse modulated input signal.

* * * * *